US010972108B1

(12) United States Patent
Li et al.

(10) Patent No.: US 10,972,108 B1
(45) Date of Patent: Apr. 6, 2021

(54) SYSTEMS AND METHODS FOR REDUCTION OF IN-PHASE AND QUADRATURE-PHASE (IQ) CLOCK SKEW

(71) Applicant: QUALCOMM Incorporated, San Diego, CA (US)

(72) Inventors: Miao Li, San Diego, CA (US); Li Sun, Irvine, CA (US); Hao Liu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/864,652

(22) Filed: May 1, 2020

Related U.S. Application Data (60) Provisional application No. 62/944,805, filed on Dec. 6, 2019.

(51) Int. Cl.
| | | |
|---|---|---|
| *H03L 7/081* | (2006.01) | |
| *H03L 7/093* | (2006.01) | |
| *G06F 15/78* | (2006.01) | |
| *H03L 7/097* | (2006.01) | |
| *H03M 9/00* | (2006.01) | |
| *H03L 7/099* | (2006.01) | |

(52) U.S. Cl.
CPC ........ *H03L 7/0818* (2013.01); *G06F 15/7807* (2013.01); *H03L 7/093* (2013.01); *H03L 7/097* (2013.01); *H03L 7/0992* (2013.01); *H03M 9/00* (2013.01)

(58) Field of Classification Search
CPC ..... H03L 7/0818; H03L 7/097; H03L 7/0992; G06F 15/7807; H03M 9/00

USPC .................................................. 327/156-158
See application file for complete search history.

(56) References Cited

U.S. PATENT DOCUMENTS

| | | | | |
|---|---|---|---|---|
| 3,667,031 A | * | 5/1972 | Cox, Jr. .................. | H03L 7/087 327/156 |
| 4,308,619 A | * | 12/1981 | Hughes ................. | H04L 7/0331 327/146 |
| 5,572,167 A | * | 11/1996 | Alder ........................ | H03L 7/07 327/156 |
| 5,610,954 A | * | 3/1997 | Miyashita ............... | H03K 5/133 375/375 |
| RE38,482 E | * | 3/2004 | Leung .................. | H03K 3/0231 327/154 |
| 6,947,514 B1 | * | 9/2005 | Kato ....................... | H03L 7/113 327/156 |
| 8,508,308 B2 | * | 8/2013 | Dong ........................ | H03L 7/08 331/179 |
| 8,536,915 B1 | * | 9/2013 | Terrovitis ................ | H03L 7/099 327/158 |
| 8,923,375 B2 | * | 12/2014 | Qu ........................... | H04L 1/205 375/226 |

(Continued)

*Primary Examiner* — Adam D Houston
(74) *Attorney, Agent, or Firm* — Haynes and Boone, LLP (57) ABSTRACT

A clock system including: an in-phase clock input and an in-phase clock output; a quadrature clock input and a quadrature clock output; a control loop configured to receive the in-phase clock output and the quadrature clock output, the control loop including a Boolean logic gate coupled to an operational amplifier (op-amp) through a low-pass filter; and an analog delay element coupled between the quadrature clock input and the quadrature clock output, the analog delay element comprising a plurality of capacitors.

24 Claims, 6 Drawing Sheets

(56) References Cited

U.S. PATENT DOCUMENTS

| | | | |
|---|---|---|---|
| 2012/0105110 A1* | 5/2012 | Kitayama | H03G 3/30 327/105 |
| 2012/0139595 A1* | 6/2012 | Kamath | H03L 7/0812 327/158 |
| 2012/0274372 A1* | 11/2012 | Nilsson | H03L 7/0891 327/157 |
| 2013/0154698 A1* | 6/2013 | Bottelli | H03L 7/08 327/157 |
| 2013/0214829 A1* | 8/2013 | Talwalkar | G09G 5/008 327/156 |
| 2019/0007053 A1* | 1/2019 | Hailu | H03M 9/00 |
| 2019/0293755 A1* | 9/2019 | Cohen | G01S 7/295 |
| 2020/0106429 A1* | 4/2020 | Doppalapudi | H04L 25/028 |
| 2020/0321943 A1* | 10/2020 | Thijssen | H03M 1/0629 |

\* cited by examiner

SYSTEMS AND METHODS FOR REDUCTION OF IN-PHASE AND QUADRATURE-PHASE (IQ) CLOCK SKEW

CROSS-REFERENCE TO RELATED APPLICATIONS

The present application claims the benefit of U.S. Provisional Patent Application No. 62/944,805, filed Dec. 6, 2019, the disclosure of which is incorporated by reference herein in its entirety.

TECHNICAL FIELD

The present application relates, generally, to clock distribution systems, and more particularly, to addressing skew between in-phase and quadrature clock signals.

BACKGROUND

The use of high-speed serial communication links in electronic systems has continued to grow. High-speed serial communication links include, e.g., Universal Serial Bus (USB), High Definition Multimedia Interface (HDMI®), Serial Advanced Technology Attachment (SATA), and Peripheral Component Interconnect Express (PCIe) interface can operate according to various standards. A serializer-deserializer (SerDes) is used to transmit and receive from a serial communication link. SerDes typically uses multiple clock signals to perform its function. SerDes may use, for example, two clock signals (in-phase clock and quadrature clock) that are separated by 90 degrees. SerDes performance can be degraded if these clock signals do not maintain the 90-degree phase shift. For example, the mismatch between clock signals can increase bit-error-rate (BER) when the clock signals are used to sample data at a receive side.

SUMMARY

Various implementations provide systems and methods that provide improved performance of in-phase and quadrature clock applications by reducing an amount of skew. For instance, one implementation uses a feedback loop having an analog delay element to slow down or speed up one clock relative to the other.

According to one implementation, a clock system includes an in-phase clock input and an in-phase clock output; a quadrature clock input and a quadrature clock output; a control loop configured to receive the in-phase clock output and the quadrature clock output, the control loop including a Boolean logic gate coupled to an operational amplifier (op-amp) through a low-pass filter; and an analog delay element coupled between the quadrature clock input and the quadrature clock output, the analog delay element comprising a plurality of capacitors.

According to another implementation, a method includes receiving an in-phase clock signal and a quadrature clock signal at a logic gate; generating a first signal having a DC signal level corresponding to a skew between the in-phase clock signal and the quadrature clock signal; and controlling an analog delay element to adjust a delay of the quadrature clock signal in response to the DC signal level.

According to yet another implementation, a circuit device includes means for adjusting a delay of a first clock signal relative to a second clock signal, the adjusting means placed along a clock path for the first clock signal, the adjusting means having a variable capacitance that adjusts a delay of the second clock signal; means for comparing a phase difference between the first clock signal and the second clock signal and for generating an output signal with a signal level corresponding to the phase difference; and means for receiving the output signal from the comparing means and for generating a control signal, in response to the output signal, to adjust the variable capacitance.

DETAILED DESCRIPTION

As explained above, in some cases, there may be a mismatch between the in-phase clock signal and the quadrature clock signal. The mismatch may also be referred to as skew, which denotes deviation from the intended ninety-degree phase difference. Such skew, without efficient correction, may deteriorate the jitter budget at receiver (RX) side of a serializer-deserializer (SerDes).

In high-speed SerDes design, such as in a 2× oversampling clock and data recovery (CDR) structure, the in-phase clock and the quadrature-phase clock are out-of-phase by 90 degrees. When either clock is used to be aligned with the incoming data edge, the other clock samples the data usually the middle of the data period. In addition to existing inter-symbol interference (ISI) jitter, phase locked loop (PLL) jitter, and so on, skew may make the bit error rate (BER) even worse. For instance, the data may be sampled incorrectly due to the jitter budget being reduced due to the skew. Thus, skew correction techniques may be used to achieve an acceptable BER target in SerDes design.

As clock frequency increases, the skew correction may become more challenging. An example technique includes adding digitally controlled current on the clock path in order to affect its rising/falling edge and thus affect its delay time. Such technique may become ineffective, especially for advanced process nodes which push rates higher. Headroom may be smaller than before, accuracy may be problematic, and the correction range may be limited. At advanced processes and high frequency clocking, the traditional technique may be inefficient in terms of accuracy and tuning range. Thus, a more efficient method is desirable.

According to one example implementation, an in-phase clock signal and a quadrature phase clock signal are received at a skew correction circuit. For example, the skew correction circuit may be included in a SerDes application or in another appropriate application. Various implementations may adjust a phase of the in-phase clock signal or the quadrature clock signal, though the examples herein focus on adjusting a quadrature clock signal. Nevertheless, it is understood that other implementations may just as well adjust either clock signal.

Continuing with the example, the skew correction circuit has an in-phase clock input and an in-phase clock output as well as a quadrature clock input and a quadrature clock output. A control loop is configured to receive the in-phase clock output and the quadrature clock output and is also configured to generate a first signal having a direct current (DC) signal level corresponding to a skew between the in-phase clock output and the quadrature clock output. In one example, the control loop may include a NAND gate that receives the in-phase clock signal and the quadrature clock signal or perhaps a reduced or divided version of each of the in-phase clock signal and the quadrature clock signal. Assuming that the quadrature clock signal is designed to lag the in-phase clock signal by 90° and assuming that both the quadrature clock signal and the in-phase clock signal have a 50% duty cycle, then the two clock signals will overlap 25% of the time. As applied to the NAND gate, the 25% overlap results in an output signal having a duty cycle of 75%. Of course, as skew changes the phase difference to 89° or 91°, the duty cycle of the output signal from the NAND gate may accordingly increase or decrease.

Further in the example, a low-pass filter at the output of the NAND gate may be used to generate the first signal having a DC signal level corresponding to the skew. A NAND gate is one example of a Boolean logic gate that may be used to generate a signal indicative of a phase difference between the two clocks, and the scope of implementations may include any appropriate logic gate, such as an AND gate.

Additionally, the skew correction circuit may also include a comparing circuit that receives the first signal having a DC signal level and in response outputs a second signal corresponding to a difference between the first signal and a reference voltage signal. The example may further include a single-to-differential voltage converter that receives the second signal and outputs a differential control signal to an analog delay element.

An example analog delay element may include a capacitive circuit through which the quadrature clock signal passes and is affected by a level of capacitance. The differential control signal may control the level of capacitance of a variable capacitance so that the quadrature clock signal can be either incrementally sped up or slowed down to counteract an amount of skew.

Various implementations include methods that may be performed by a system that has a skew correction circuit. In one example, the method includes receiving an in-phase clock signal and a quadrature clock signal at a logic gate. The logic gate, and perhaps associated circuitry such as a low-pass filter, generates a first signal having a DC signal level corresponding to a skew between the in-phase clock signal and the quadrature clock signal. The method further may include controlling an analog delay element to adjust a delay of the quadrature clock signal in response to the DC signal level.

Thus, the disclosure includes implementations having an analog delay element within a control loop to reduce skew of an in-phase and quadrature (IQ) clock system. Various implementations provide advantages over other systems. For instance, the analog delay element would generally be expected to provide performance over a variety of process, voltage, and temperature (PVT) conditions because it reacts proportionally to an experienced skew. By contrast, an alternative system using a plurality of transistors to implement a digital delay may be generally expected to employ recalibration as PVT conditions change. Thus, an advantage of some implementations is that they may omit some or all of the recalibration that would be expected of a digital skew correction system.

Also, because the various implementations react proportionally to an experienced skew, they are generally expected to provide correction of any amount of skew great enough to affect operation of the system. However, a digital system would be designed to have a large enough number of transistors to provide an appropriate resolution per degree of skew, thereby potentially making a larger circuit than could be achieved by the analog implementations described below.

Figure 1:
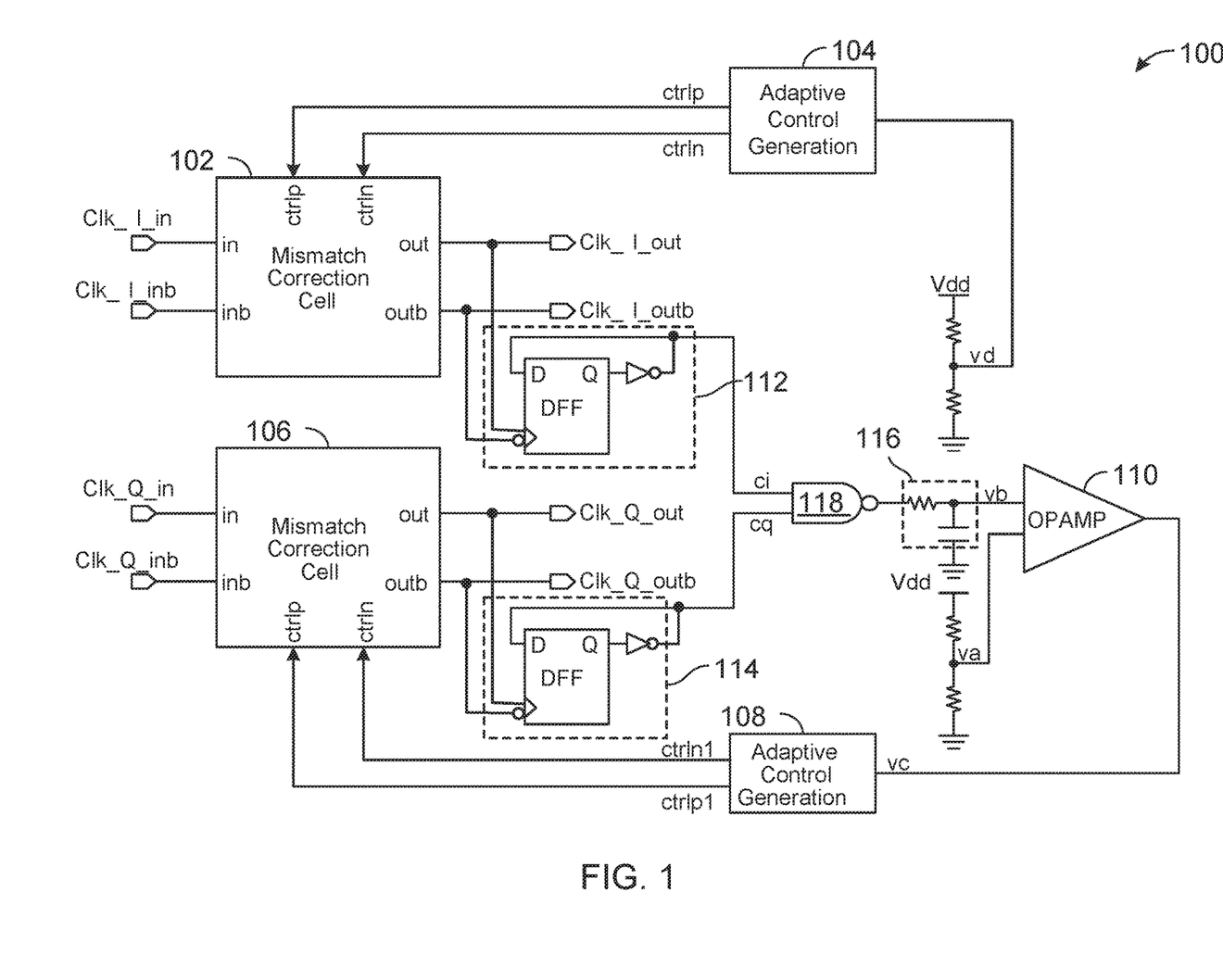
FIG. 1 is an illustration of example skew correction circuitry to correct in-phase and quadrature (IQ) mismatch according to one implementation.

According to principles described herein, a skew correction circuit 100 including an analog tuning loop for correcting in-phase and quadrature (IQ) skew is disclosed. According to the present example, and as shown in FIG. 1, a first mismatch correction cell 102 is placed within the path of the in-phase clock. A second mismatch correction cell 106 is placed within the path of the quadrature clock.

The present example adjusts the quadrature clock signal to maintain a relationship in which the quadrature clock signal lags the in-phase clock signal by 90°. Thus, the example implementation of FIG. 1 does not include adjusting the in-phase clock signal, though the in-phase clock signal path does include the adaptive control generation 104 and mismatch correction cell 102. The in-phase clock signal path includes the adaptive control generation 104 and mismatch correction cell 102, which are substantially the same as adaptive control generation 108 and mismatch correction cell 106 of the quadrature clock signal path, so that both the in-phase clock signal and the quadrature clock signal experience approximately the same delays within the skew correction circuit of FIG. 1 (excepting, of course, delay for adjustment within the quadrature clock path).

Furthermore, the skew correction circuit 100 of FIG. 1 may be implemented in a variety of applications, such as those described in more detail below with respect to FIGS. 5 and 6. In other words, the skew correction circuit 100 of FIG. 1 may be implemented in any appropriate application using an IQ clock system.

In this example, the in-phase clock signal acts as a reference and the quadrature signal is adjusted in real-time to maintain a 90-degree phase shift to the in-phase clock. The clock signals are differential clock signals, so that the mismatch correction cell 102 has an in-phase (I) clock input (Clk_I_in and Clk_I_inb, where the signals are differential) and an in-phase clock output (Clk_i_out and Clk_i_outb, where the signals are differential as well). Similarly, mismatch correction cell 106 has a quadrature (Q) clock input (Clk_Q_in and Clk_Q_inb, where the signals are differential) and a quadrature clock output (Clk_Q_out and Clk_Q_outb, where those signals are differential as well).

The I and Q clock outputs go to a frequency divider, such as a "Div-by-2" circuits 112 and 114, each of which includes a DFF (delay flip-flop) and an inverter. In other words, the DFF generates a reduced or divided clock signal for each of the I and Q clock outputs. The DFFs remove any duty-cycle effect of the clock signals, creating outputs ci and cq having 50° duty cycles, such that the tuning process is not affected by any duty cycle distortion that might be present in the original I and Q clock signals.

Outputs ci and cq are used as inputs to NAND gate 118. The output of the NAND gate 118 is ones and zeros, and it is coupled to a resistive-capacitive (RC) filter 116, which is a low-pass filter that extracts the DC component of the NAND gate output. Based on the Div-by-2 structure 112, 114 shown, the DC component is expected to be ⅝ of Vdd when the quadrature clock signal lags the in-phase clock signal by 90°. In this example, Vdd refers to voltage drain drain, and it is a power supply. The scope of implementation is not limited to ⅝ of Vdd, as other implementations using different duty cycles or different Boolean logic gates may have a different fraction of Vdd at vb.

If the quadrature clock signal lags the in-phase clock signal by 89°, then the two clock signals would have more overlap, thereby decreasing the duty cycle of the output of NAND gate 118 and reducing the DC signal level at vb. If the quadrature clock signal lags the in-phase clock signal by 91°, then the two clock signals would have less overlap, thereby increasing the duty cycle of the output of NAND gate 118 and increasing the DC signal level at Vb. In other words, vb has a DC signal level corresponding to a skew between the in-phase clock signal and the quadrature clock signal.

The DC signal vb is fed to the + input of operational amplifier (op-amp) 110. DC signal va is fed to the inverting (−) input of op-amp 110. The DC signal va is used as a reference and is set to ⅝ of Vdd using a resistor voltage divider. The DC signal va is set to ⅝ of Vdd in this example to match the level of vb when the IQ phase difference is 90 degrees. Of course, in other implementations having a different fraction of Vdd at 90-degree phase difference, va would be set to that fraction of Vdd as appropriate. Op-amp 110 acts as a comparing circuit to output signal vc, which is proportional to a difference of vb and va. Since va is constant in this example, when vb increases, so does vc, and when vb decreases vc decreases as well. The gain of op-amp 110 may be set to any appropriate value. Generally, it is expected that a higher gain for op-amp 110 may allow the system to act on a smaller amount of skew, though perhaps using more power.

Figure 2:
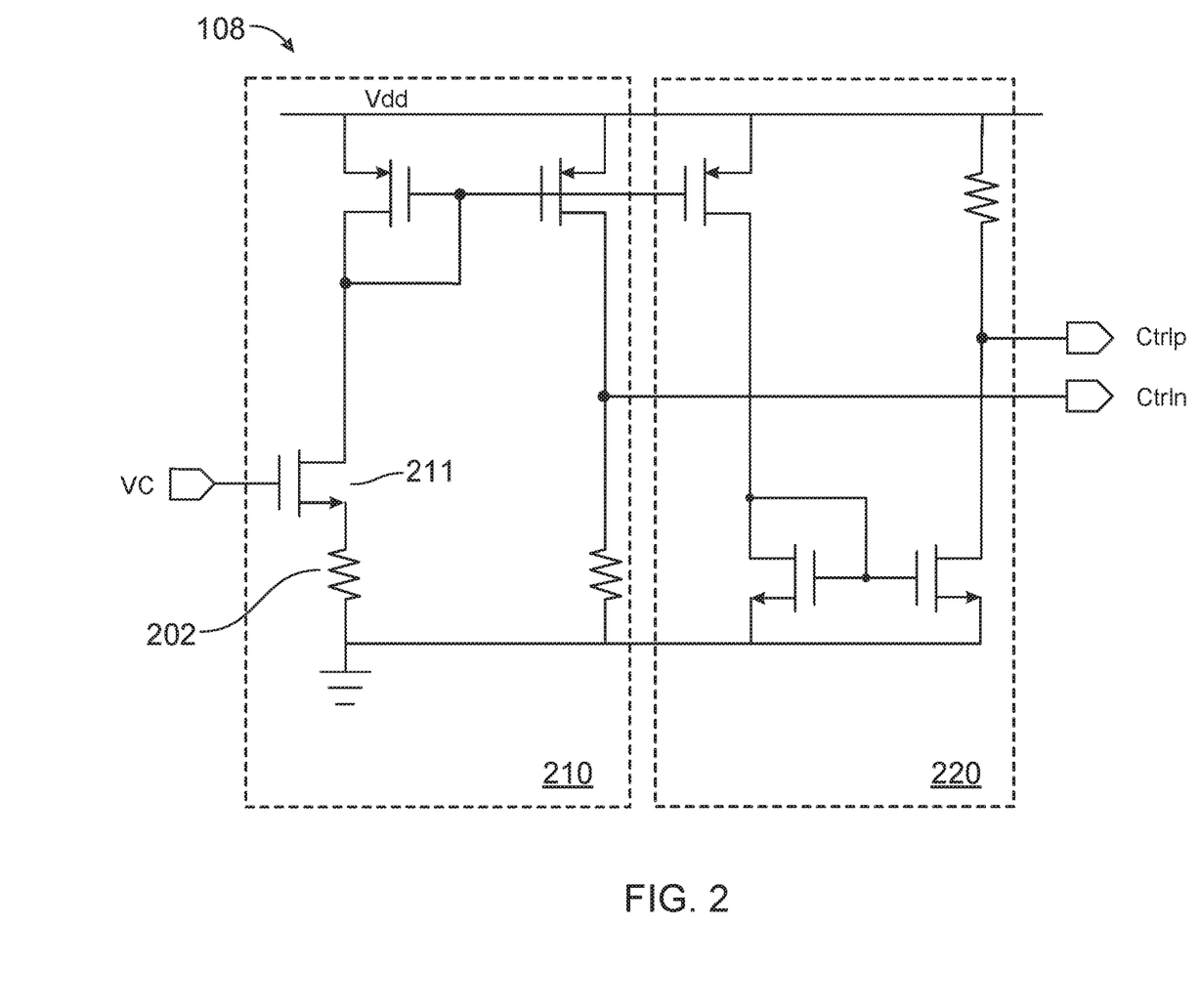
FIG. 2 is an illustration of an example mismatch correction cell, according to one implementation.

The output, vc, goes to adaptive control generation 108, which will be shown in more detail in FIG. 2 and accompanying text. The output of the adaptive control generation 108 produces differential control signals ctrlp/ctrin. These control signals are generated to tune the delay of the quadrature phase so that the 90-degree phase shift is maintained between the in-phase and quadrature clock signals. The mismatch correction cell 106, which receives the differential control signals ctrlp/ctrin, is described in more detail with respect to FIG. 3.

As noted above, adaptive control generation 104 is substantially the same as adaptive control generation 108, and mismatch correction cell 102 is substantially the same as mismatch correction cell 106. Accordingly, a fixed voltage, vd, is used to control the delay of the in-phase clock signal using adaptive control generation 104. In this example, vd is set using a resistor divider so that the in-phase clock signal delay, as applied by mismatch correction cell 102, may be placed at approximately the middle of the quadrature delay tuning range so as not to waste any tuning range for the quadrature clock signal.

FIG. 2 illustrates one implementation of the adaptive control generation 108. Adaptive control generation 108 includes the input vc from the output of op-amp 110 in FIG. 1. Adaptive control generation 108 also includes the outputs ctrlp and ctrin, which are fed to the mismatch correction cell 106. Adaptive control generation 108 includes two current mirrors 210, 220, which act as a single-to-differential converter. Put another way, adaptive control generation 108 generates a differential control signal (ctrlp, ctrin) in response to the DC signal level of vc. As vc increases, the difference between ctrlp and ctrin decreases. Similarly, as vc decreases, the difference between ctrlp and ctrin increases. As explained further below with respect to FIG. 3, as vc increases, this causes the mismatch correction cell 106 to speed up.

As shown, the vc signal (output of the op-amp 110), is applied to current mirrors 210, 220 to create the differential control signal ctrlp and ctrin. Resistor 202 at the source of the negative-channel metal-oxide semiconductor (NMOS) 211 may improve the linearity of the delay vs. control curve of the skew correction circuit 100. Simulation of the system indicates that the delay tuning range may be within a range of about −7 ps and +9 ps over process, voltage, and temperature (PVT) corners at a clock frequency of 10 GHz. This range may be acceptable for many applications, when taking into account that a 90-degree phase shift in this example implementation is 25 ps. Similarly, an example delay tuning range may be approximately 28%-36% over PVT corners at 10 GHz clock operation, which may also be acceptable for many applications. Thus, another advantage of some implementations includes improved linearity and delay tuning range.

Adaptive control generation 104 is similar to adaptive control generation 108 as illustrated in FIG. 2. A difference would be that adaptive control generation 104 receives DC signal vd rather than DC signal vc. In this example implementation, it would be generally expected that the differential control signal ctrlp and ctrin generated by adaptive control generation 104 would be constant so long as vd is constant as well. Therefore, mismatch correction cell 102 would generally be expected to apply a constant delay to the in-phase clock signal.

Figure 3:
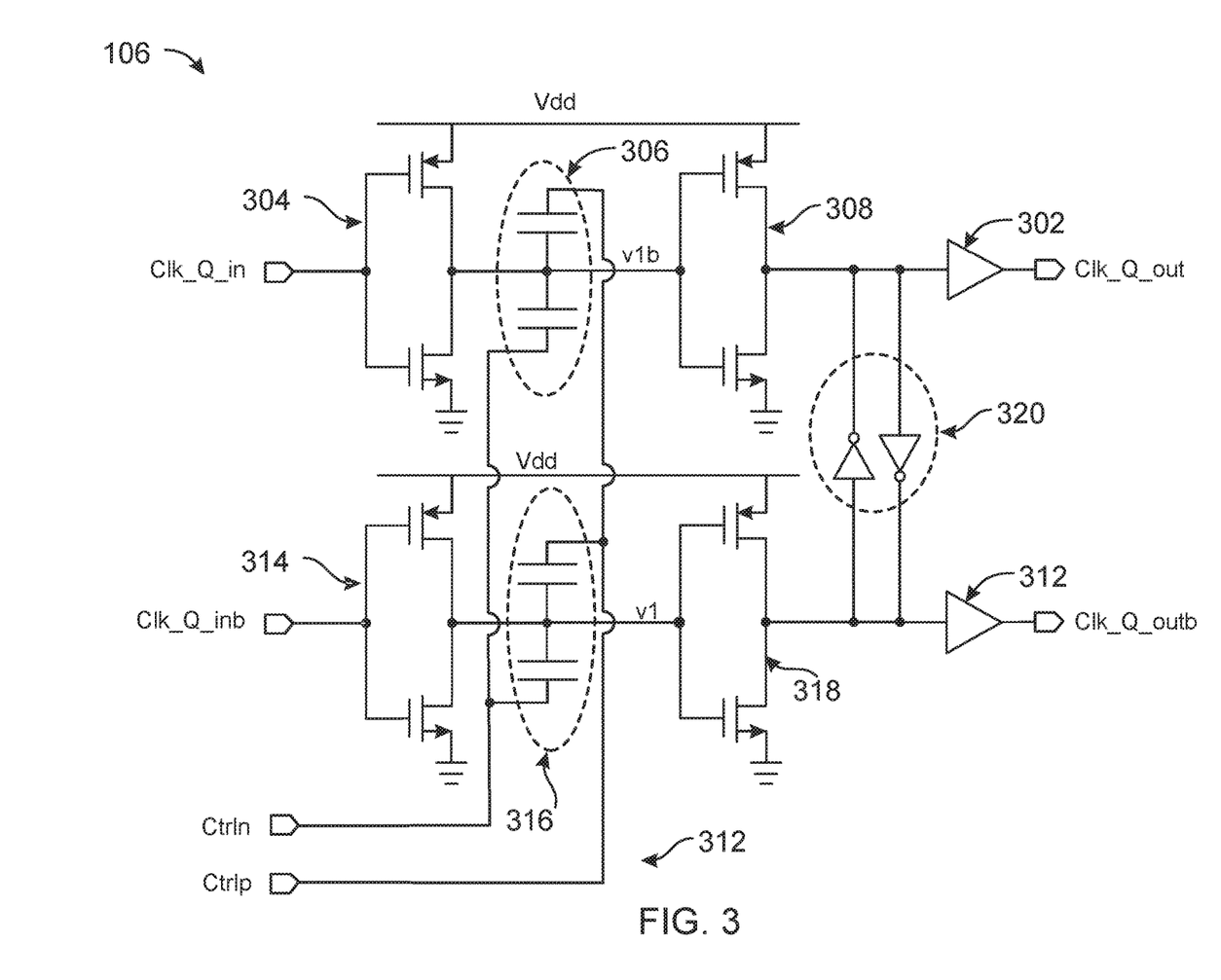
FIG. 3 is a diagram showing an example adaptive control generation structure, according to one implementation.

FIG. 3 illustrates the mismatch correction cell 106 in more detail according to some aspects of the disclosure. The differential control signal having ctrlp and ctrin is connected to two parallel-connected NMOS capacitors 306, 316. NMOS capacitors 306, 316 change capacitance based on the voltage level across them. In other words, the capacitance of capacitors 306, 316 corresponds to a voltage level of the differential control signal having ctrlp and ctrin. Thus, the differential control signal having ctrlp and ctrin may be used to tune the capacitance values of the NMOS capacitors. Different capacitances in the NMOS capacitors 306, 316 may change the delay of the quadrature clock signal.

Looking at the structure of mismatch correction cell 106, it includes the quadrature clock input Clk_Q_in and Clk_Q_inb and the quadrature clock output Clk_Q_out and Clk_Q_outb. The quadrature clock input is received at inverters 304, 314 before being passed to capacitors 306, 316. The capacitors 306, 316 act as an analog delay element, which is configured to adjust a delay of the quadrature clock output in response to the skew, as skew affects the DC signal level of vb. The capacitors 306, 316 are NMOS capacitors in this example, though the scope of implementations may include a variable capacitance having any appropriate architecture.

The quadrature clock signal is a differential signal, and when it is delayed by capacitors 306, 316 it produces signals v1b and v1. Note at this point, the polarity of the signals has been switched because of inverters 304, 314. The signals v1b and v1 are then passed to inverters 308, 318, so that the two differential components return to their original polarities. The clock signals are then passed to buffers 302, 312, which each add a fixed and known delay. Buffers 320 provide signal restoration. Buffers 302, 312 generate the quadrature clock output Clk_Q_out and Clk_Q_outb. An advantage of using the differential structure shown in FIG.

3 may include reducing a duty-cycle effect (duty cycle distortion of the clock signals) when tuning clock rising/falling time.

Mismatch correction cell 102 in the in-phase clock path may be substantially the same as mismatch correction cell 106. Differences may include that mismatch correction cell 102 includes the in-phase clock input (Clk_I_in and Clk_I_inb) and in-phase clock output (Clk_I_out and Clk_I_outb) and receives the differential control signals ctrlp and ctrin from adaptive control generation 104.

During operation of the circuits described herein, if the quadrature clock signal falls behind the in-phase clock signal, then the vc output of the op-amp 110 goes up. As vc goes up, the value of the capacitances of the NMOS capacitors 306, 316 goes down. This, in turn, speeds up the quadrature clock signal to compensate for the skew. Conversely, if the quadrature clock signal gets ahead of the in-phase clock signal, then the vc output of the op-amp 110 goes down. As vc goes down, the value of the capacitances of the NMOS capacitors 306, 316 goes up. This, in turn, slows down the quadrature clock signal to compensate for the IQ mismatch.

The scope of implementations is not limited to adjusting a quadrature clock signal. Rather, other implementations may adjust an in-phase clock signal in the same manner. For instance, taking the skew correction circuit of FIG. 1, the inputs to op-amp 110 would be switched so that vb is fed to the inverting input and va is fed to the + input. The DC signal vc would then be fed to adaptive control generation 104, and the DC signal vd would instead be fed to adaptive control generation 108. In fact, the scope of implementations is not limited to in-phase and quadrature clocks, as any two clocks having a desired phase difference may benefit from the principles described herein. For instance, any two clocks with an arbitrary phase difference may be corrected for skew using a system described above by calibrating va and vd to maintain the desired phase difference.

Figure 4:
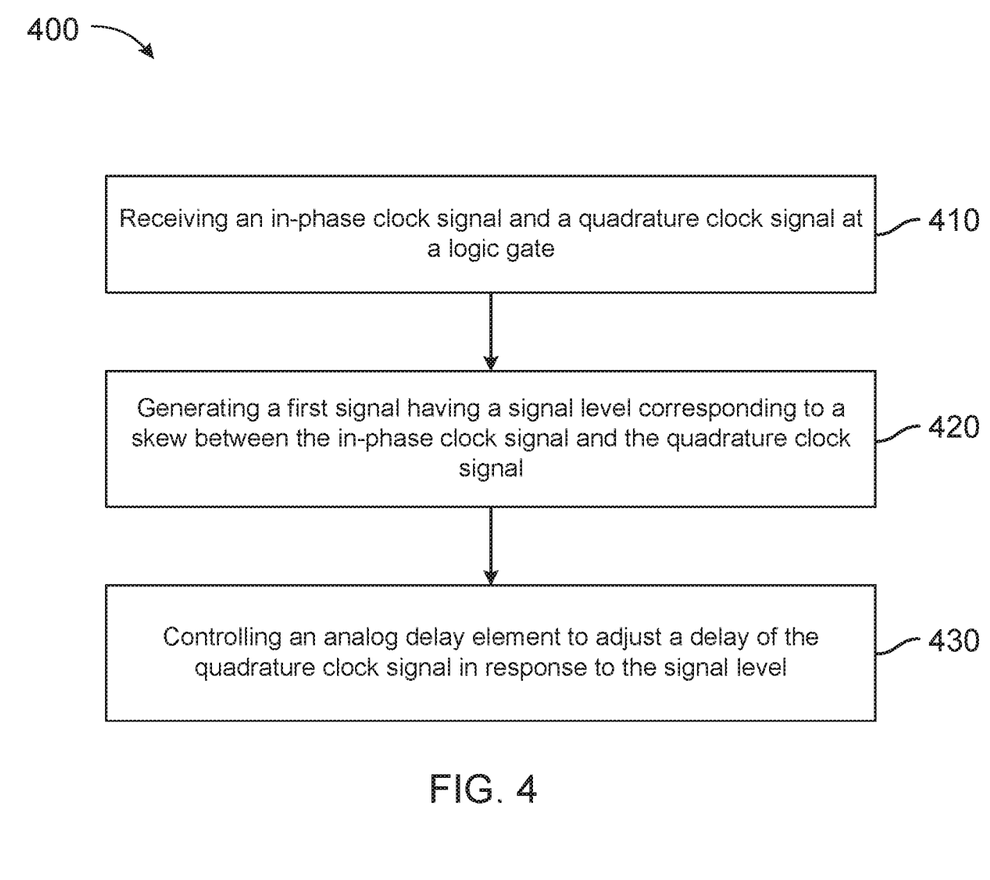
FIG. 4 is a flowchart illustrating an example method of performing skew correction, according to one implementations.

FIG. 4 illustrates a method 400 for maintaining a desired phase difference between two clocks, according to one implementation. Method 400 may be performed by a skew correction circuit, such as skew correction circuit 100 of FIG. 1 and its various components illustrated in FIGS. 2 and 3.

At action 410, the skew correction circuit receives an in-phase clock signal and a quadrature phase clock signal at a logic gate. An example is shown in FIG. 1, in which a divided or reduced clock is output from each of the DFFs and used as inputs ci and cq to NAND gate 118.

At action 420, the system generates a first signal having a signal level corresponding to a skew between the in-phase clock signal and the quadrature phase clock signal. An example is shown in FIG. 1, where the DC signal Vb has a signal level that corresponds to a skew. For instance, as the phase shift either decreases below 90° or increases above 90°, the DC signal level of vb decreases or increases accordingly. The first signal may be generated in any appropriate manner, such as by applying an RC low-pass filter to the output of the logic gate. However, the scope of implementations is not limited to any particular technique to generate the first signal.

At action 430, the system controls an analog delay element to adjust the delay of the quadrature phase clock signal in response to the signal level. In the example of FIGS. 1-3, the system includes generating a differential control signal having cntrl and cntrlp from the first signal vb and using that differential control signal to adjust a capacitance either up to add more delay or down to reduce delay of the quadrature phase clock signal. FIG. 3 provides an example as to how to delay a clock signal using adjustable capacitance.

The scope of implementations is not limited to the series of actions shown in FIG. 4. Rather, other implementations may add, omit, rearrange, or modify the actions of FIG. 4. For instance, various implementations may continually perform method 400 as long as the two clock signals are received, thereby maintaining the desired phase difference. Additionally, various implementations may be a part of a larger data transfer technique or system, as explained further below with respect to FIGS. 5-6.

Figure 5:
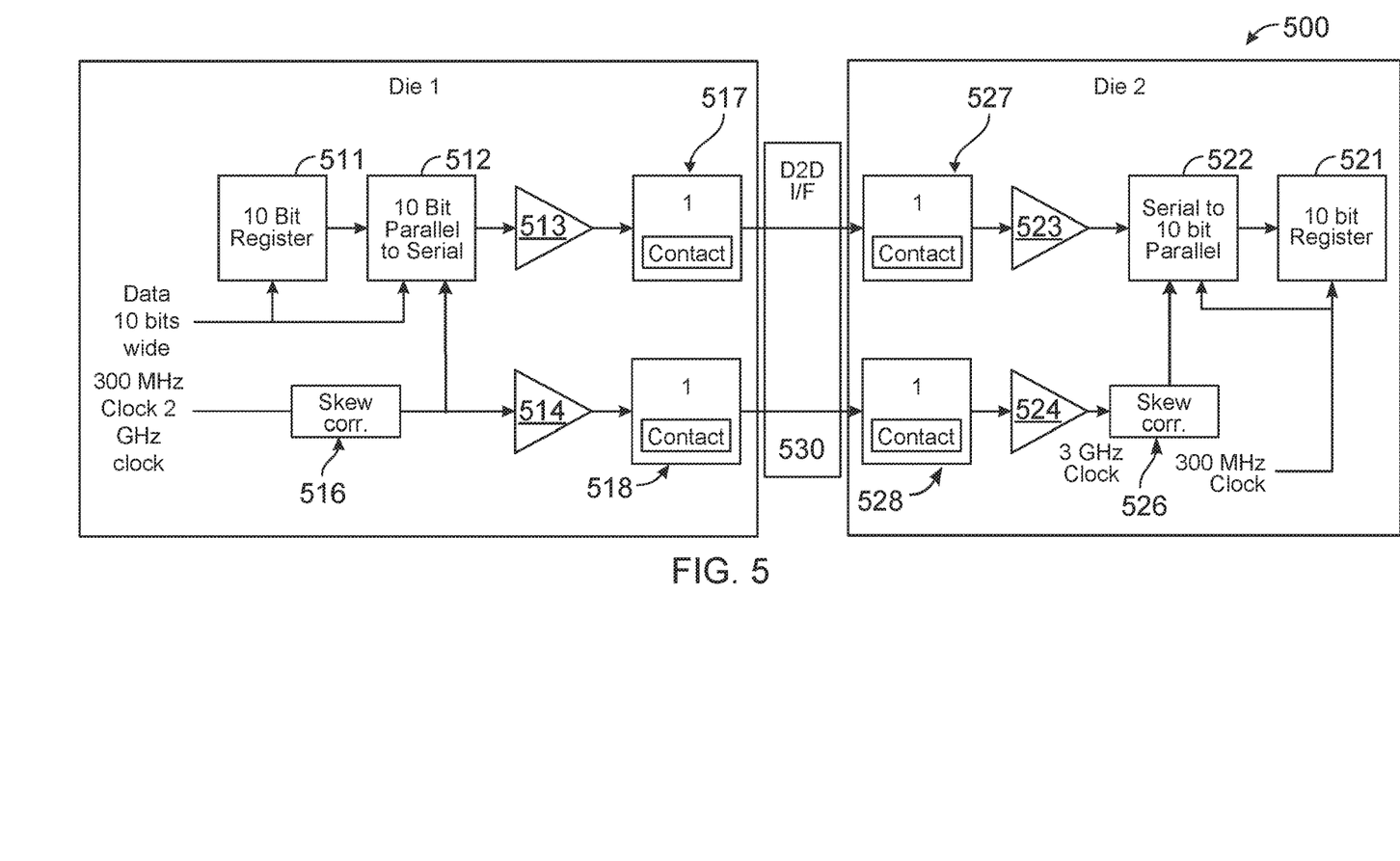
FIG. 5 is an illustration of an example data and clock interface employing skew correction circuitry, such as that of FIG. 1, according to one implementation.

FIG. 5 is an illustration of an example SerDes interface 500, which may include skew correction principles discussed herein according to an implementation of the disclosure. Specifically, FIG. 5 illustrates serializer and deserializer circuitry, which may be used in some applications to reduce a number of electrical contacts for transferring data and clock signals between Die 1 and Die 2. For instance, Die 1 and Die 2 may both implement computer processors in a same package or in different packages. In another example, one of the dies may be a computer processor, and the other of the dies may be a memory chip. In the present example, Die 1 is transmitting data bits and a clock signal to Die 2.

Die 1 receives 10 parallel bits at 10-bit register 511, clocked in at 300 MHz. Register 511 clocks the bits out at 300 MHz to 10 bit parallel-to-serial circuit 512. Parallel-to-serial circuit 512 receives the 300 MHz clock to input the parallel bits, and it outputs the bits according to a 3 GHz clock. The parallel-to-serial circuit 512 outputs the bits serially to driver 513 and on to electrical contact 517. Similarly, the 3 GHz clock is output by driver 514 to contact 518. In this example, the bits are transmitted serially, so they use one physical electrical contact 517.

Of course, the scope of implementations is not limited to the particular values of the clocks in FIG. 5, as the principles described herein may be applied to any appropriate clock. Furthermore, while not explicitly shown in FIG. 5, it is understood that the 300 MHz clock and the 3 GHz clock may each be implemented as in-phase and quadrature clock signals. The drawing of FIG. 5 represents each clock as a line for ease of reference, though it is understood that each line could be illustrated as two lines—one for an in-phase clock signal and one for a quadrature clock signal. Additionally, one particular application for an IQ clock is to line up the in-phase clock signal with a leading edge of data so that the quadrature clock signal is lined up with a middle of the data, where the quadrature clock signal is used by data capture elements (e.g., flip-flops) to capture the data.

Both the clocks and the data bits traverse the die-to-die links 530 in the die-to-die interface (D2D I/F). The data bits are received at electrical contact 527, and the 3 GHz clock is received at electrical contact 528. The data bits are conducted from electrical contact 527 to driver 523, and on to serial-to-parallel circuit 522. Serial-to-parallel circuit 522 receives the data bits according to the 3 GHz clock and outputs 10 bits in parallel to the 10 bit register according to the 300 MHz clock. The 300 GHz clock is conducted from the electrical contact 528 to the driver 524 and to the serial-to-parallel circuit 522. The 10 bit register operates according to the 300 MHz clock and stores the bits in parallel.

The implementation of FIG. 5 may include skew correction circuits in any appropriate location. For instance, skew correction circuit 516 is shown before the inputs to the parallel-to-serial circuit 512 and the driver 514. In this example, skew correction circuit 516 may be the same as or similar to the skew correction circuit of FIG. 1, and it is used in this example to maintain a 90° phase shift between the in-phase and quadrature clock signals of the high-speed 3 GHz clock.

The example of FIG. 5 also includes another skew correction circuit 526, similar to are the same as the skew correction circuit of FIG. 1, at the output of driver 524. Skew correction circuit 526 in this example is used to maintain the 90° phase shift between the in-phase and quadrature clock signals of the high-speed 3 GHz clock. Various implementations may include one or more skew correction circuits, such as 516 or 526, in any appropriate location. For instance, another example implementations may omit skew correction circuit 516 in favor of skew correction circuit 526 in order to save silicon area. In another example implementations, skew correction circuit 526 may be omitted in favor of skew correction circuit 516 to save silicon area.

In yet another example, one or more skew correction circuits may be placed between driver 514 and contact 518 or between contact 528 and driver 524. Furthermore, while FIG. 5 illustrates skew correction circuits 516 and 526 applied to the 3 GHz clock signal, it is understood that skew correction circuits may also be applied to the 300 MHz clock as appropriate. An advantage of the system of FIG. 5 is that it may maintain the desired phase shift between the in-phase and quadrature clock signals, thereby reducing a potential bit error rate and allowing the use of higher-speed clocks, such as the 3 GHz clock illustrated here.

The example implementation of FIG. 5 shows data and clock signals being transferred from Die 1 to Die 2. FIG. 6 is an illustration of an example chip-to-chip interface 600 that may implement the SerDes interface 500 of FIG. 5 as a high-speed serial link. High-speed serial links may be used, for example, to carry data between two CPUs or other processing or memory devices. High speed serial links, such as those used in Peripheral Component Interconnect (PCI) Express or other applications may benefit from the skew correction principles discussed herein.

Figure 6:
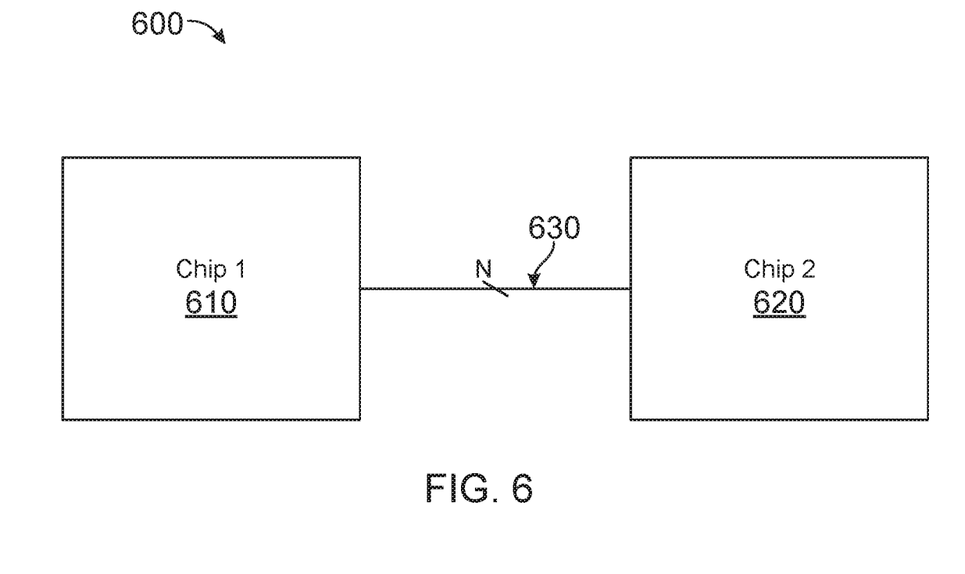
FIG. 6 is an illustration of an example chip-to-chip interface, which employs skew correction circuitry, such as that of FIG. 1, according to one implementation.

FIG. 6 shows two chips—chip 610 and chip 620, which in this case may be any appropriate semiconductor chip or chip package. In one example, chip 610 and chip 620 are both multi-core processor chips that are each mounted in respective sockets, and those sockets are mounted on a printed circuit board or other appropriate substrate. Link 630 is a physical link made of a conductive material, such as copper, formed in traces or on a board. In fact, link 630 multiple (N) conductive lines from chip 610 to chip 620, where N is an integer greater than one.

Further continuing with this example, link 630 not only provides a chip-to-chip interface, but each of the conductive lines provides a high-speed serial link between a transmitter at chip 610 and a receiver at chip 620. Each transmitter at chip 610 may serialize data and send it over one of the conductive lines, where the serialized data is received at chip 610 and de-serialized accordingly, using circuitry the same as or similar to that shown with respect to FIG. 5. Furthermore, one or more of the conductive lines of link 630 may transmit clock signals, such as shown with respect to FIG. 5. Such clock signals may be subject to skew correction. For instance, as the clock signal is transmitted from chip 610 to chip 620, skew correction circuitry may be used at either or both of chip 610 and 620 to maintain a desired phase difference. In more detail, circuitry from FIG. 5, including the skew correction circuits 516 and 526, drivers 514 and 524, and contact 518 528 may be implemented to transmit a IQ clock from chip 610 to 620.

The scope of implementations is not limited to any particular type of chip. For instance, the principles described herein may be applied to systems on chip (SOCs), memory chips, and the like. Additionally, the scope of implementations is not limited to any particular type of physical mounting, as any appropriate physical mounting may be used.

The principles described herein may be used in many types of applications using clocks having a desired phase difference, e.g., IQ clock systems. As described above, IQ clock systems may be used in SerDes links to transmit data and clock signals from processor to memory, from memory to processor, from processor to processor, and the like. One specific example includes an SOC in a handheld device, where data and clock signals may be transmitted between a central processing unit (CPU) or graphics processing unit (GPU) and a memory chip or where data is transmitted between any data processing unit.

Another example includes an artificial intelligence (AI) or machine learning application having multiple processors sharing data and operating on the data in parallel. Such connections may employ a high-speed clock, which may benefit from the skew correction techniques disclosed herein. Another example includes automotive applications in which data from a multitude of sensors is processed and shared among multiple processors to provide high-speed communication and self-driving capabilities. For instance, links between processors, links between processors and sensors, links between processors and memory, and links between processors and data transmission devices may be implemented as discussed above with respect to FIGS. 5 and 6 to reduce bit error rate and to facilitate the use of high-speed clocks.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A clock system comprising:
   an in-phase clock input and an in-phase clock output;
   a quadrature clock input and a quadrature clock output;
   a control loop configured to receive the in-phase clock output and the quadrature clock output, the control loop including a Boolean logic gate coupled to an operational amplifier (op-amp) through a low-pass filter; and
   an analog delay element coupled between the quadrature clock input and the quadrature clock output, the analog delay element comprising a plurality of capacitors.

2. The clock system of claim 1, wherein the control loop is configured to generate a first signal having a DC signal level corresponding to a skew between the in-phase clock output and the quadrature clock output.

3. The clock system of claim 1, wherein the analog delay element comprises a first capacitor and a second capacitor arranged between a first set of inverters and a second set of inverters, the analog delay element coupled to the quadrature clock input.

4. The clock system of claim 1, wherein the Boolean logic gate comprises:
   a NAND gate configured to receive a reduced quadrature clock signal from the quadrature clock output and configured to receive a reduced in-phase clock signal from the in-phase clock output.

5. The clock system of claim 1, wherein the Boolean logic gate comprises:
a NAND gate configured to receive a divided quadrature clock signal from the quadrature clock output and configured to receive a divided in-phase clock signal from the in-phase clock output.

6. The clock system of claim 1, wherein the Boolean logic gate is configured to receive a reduced quadrature clock signal from the quadrature clock output and configured to receive a reduced in-phase clock signal from the in-phase clock output, the Boolean logic gate configured to output a signal having a duty cycle corresponding to a skew between the in-phase clock output and the quadrature clock output; and
wherein the low-pass filter comprises a resistive-capacitive (RC) filter.

7. The clock system of claim 1, wherein the control loop comprises:
an operational amplifier (op-amp) configured to output a first signal corresponding to a difference between an output of the low-pass filter and a reference voltage signal; and
a single-to-differential voltage converter at an output of the op-amp and configured to receive the first signal and to output a differential control signal to the analog delay element.

8. The clock system of claim 1, wherein the control loop comprises:
a comparing circuit configured to output a first signal corresponding to a difference between an output of the low-pass filter and a reference voltage signal; and
a plurality of current mirrors at an output of the comparing circuit and configured to receive the first signal and to output a differential control signal to the analog delay element.

9. The clock system of claim 1, wherein the clock system is implemented in a serializer-deserializer (SERDES) communication link.

10. The clock system of claim 9, including a system on chip (SoC), and wherein the SERDES communication link couples a first die in the SoC to a second die in the SoC.

11. The clock system of claim 1, wherein the analog delay element is configured to adjust a delay of the quadrature clock output in response to a DC signal level within the control loop.

12. The clock system of claim 1, wherein the control loop is configured to generate a first signal having a DC signal level corresponding to a skew between the in-phase clock output and the quadrature clock output, and wherein the skew represents deviation from a ninety-degree phase shift between the in-phase clock output and the quadrature clock output.

13. The clock system of claim 1, wherein the analog delay element is configured to adjust the delay of the quadrature clock output to maintain a ninety-degree phase shift between the in-phase clock output and the quadrature clock output.

14. A method comprising:
receiving an in-phase clock signal and a quadrature clock signal at a logic gate;
generating a first signal having a DC signal level corresponding to a skew between the in-phase clock signal and the quadrature clock signal; and
controlling an analog delay element to adjust a delay of the quadrature clock signal in response to the DC signal level.

15. The method of claim 14, wherein controlling the analog delay element comprises:
maintaining a 90-degree phase difference between the in-phase clock signal and the quadrature clock signal.

16. The method of claim 14, wherein controlling the analog delay element comprises:
increasing or decreasing a capacitance of the analog delay element based on the DC signal level.

17. The method of claim 14, wherein controlling the analog delay element comprises:
increasing a capacitance of the analog delay element in response to the skew indicating that the quadrature clock signal is less than 90 degrees behind the in-phase clock signal.

18. The method of claim 14, wherein controlling the analog delay element comprises:
decreasing a capacitance of the analog delay element in response to the skew indicating that the quadrature clock signal is more than 90 degrees behind the in-phase clock signal.

19. A circuit device comprising:
means for adjusting a delay of a first clock signal relative to a second clock signal, the adjusting means placed along a clock path for the first clock signal, the adjusting means having a variable capacitance that adjusts a delay of the second clock signal;
means for comparing a phase difference between the first clock signal and the second clock signal and for generating an output signal with a signal level corresponding to the phase difference; and
means for receiving the output signal from the comparing means and for generating a control signal, in response to the output signal, to adjust the variable capacitance.

20. The circuit device of claim 19, wherein the first clock signal comprises a quadrature clock signal, and wherein the second clock signal comprises an in-phase clock signal.

21. The circuit device of claim 19, wherein the comparing means generates an output signal indicative of a skew of the first clock signal relative to the second clock signal, wherein the skew represents a deviation from a 90° phase difference.

22. The circuit device of claim 19, wherein the variable capacitance comprises a negative-channel metal-oxide semiconductor (NMOS) capacitor.

23. The circuit device of claim 19, wherein the comparing means comprises:
a Boolean logic gate receiving a reduced first clock signal and a reduced second clock signal;
a low-pass filter receiving an output from the Boolean logic gate and providing a DC signal level; and
an amplifier receiving the DC signal level and a reference voltage and outputting the signal level corresponding to the phase difference.

24. The circuit device of claim 19, wherein the circuit device is implemented in a serializer-deserializer (SERDES) communication link.

* * * * *